(12) United States Patent
Cabral, Jr. et al.

(10) Patent No.: US 8,362,600 B2
(45) Date of Patent: Jan. 29, 2013

(54) METHOD AND STRUCTURE TO REDUCE SOFT ERROR RATE SUSCEPTIBILITY IN SEMICONDUCTOR STRUCTURES

(75) Inventors: Cyril Cabral, Jr., Mahopac, NY (US); Michael S. Gordon, Yorktown Heights, NY (US); David F. Heidel, Mahopac, NY (US); Conal Eugene Murray, Yorktown Heights, NY (US); Kenneth Parker Rodbell, Sandy Hook, CT (US); Henry Hong Ki Tang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 401 days.

(21) Appl. No.: 12/689,268

(22) Filed: Jan. 19, 2010

(65) Prior Publication Data

US 2011/0175211 A1    Jul. 21, 2011

(51) Int. Cl.
*H01L 23/556*    (2006.01)
*H01L 21/60*    (2006.01)
(52) U.S. Cl. ............... 257/660; 257/428; 257/E23.115; 257/E21.502; 438/121
(58) Field of Classification Search .................. 257/660, 257/428, 659, 690, 776, E23.115, E23.141, 257/E21.502, E21.509; 438/121, 125
See application file for complete search history.

(56) References Cited

U.S. PATENT DOCUMENTS

| | | | |
|---|---|---|---|
| 6,410,990 B2 | 6/2002 | Taylor et al. | 257/786 |
| 7,381,635 B2 | 6/2008 | Cabral, Jr. et al. | 438/612 |
| 7,386,817 B1 | 6/2008 | Fiorenza et al. | 716/4 |
| 2010/0140760 A1* | 6/2010 | Tam et al. | 257/660 |

* cited by examiner

*Primary Examiner* — Minh-Loan T Tran
*Assistant Examiner* — Fazli Erdem
(74) *Attorney, Agent, or Firm* — Harrington & Smith; Louis J. Percello

(57) ABSTRACT

A method is disclosed that includes providing a semiconductor substrate having one or more device levels including a number of devices, and forming a number of wiring levels on a top surface of the one or more device levels, wherein one or more of the number of wiring levels includes one or more alpha particle blocking shields situated between at least one of the number of devices and a predetermined first location where a terminal pad will be formed in one of the wiring levels, the one or more alpha particle blocking shields placed at a second location, having one or more widths, and occupying a predetermined number of the wiring levels, sufficient to prevent a predetermined percentage of alpha particles of a selected energy or less expected to be emitted from an alpha particle emitting metallization to be formed adjacent and connected to the terminal pad from reaching the one device.

24 Claims, 10 Drawing Sheets

METHOD AND STRUCTURE TO REDUCE SOFT ERROR RATE SUSCEPTIBILITY IN SEMICONDUCTOR STRUCTURES

BACKGROUND

This invention relates generally to semiconductors and, more specifically, relates to reducing soft error rates in semiconductors.

Soft error rates in integrated circuits are caused by ionizing radiation, such as alpha particles passing through the semiconductor materials of the integrated circuit. Both logic and memory circuits may be affected. The errors are called "soft" because they generally only persist until the next cycle of the integrated circuit function. As an alpha particle passes through semiconductor material, a "cloud" of hole-electron pairs are generated in the vicinity of its path. Electric fields present in the integrated circuit can cause the holes and electrons to migrate in opposite directions, thus causing extra charge to reach particular circuit nodes and upset the function of the integrated circuit.

There are a few potential sources of alpha particles in a typical integrated circuit chip connected to its associated package using solder bumps (also known as controlled collapse chip connections or C4s). For example, in the case that the solder bumps are lead (Pb), tin (Sn) or a combination of Pb and Sn (or their alloys, such as Sn alloyed with silver, Ag), the solder bumps may contain radioactive polonium (Po) and Pb isotopes that may emit about 5.3 MeV (million electron-volt) alpha particles (that is, alpha particles having 5.3 MeV units of energy). While the quantities of radioactive Po and Pb may be in the parts-per-billion (ppb) range, the flux of alpha particles emitted may be sufficient to cause soft-error rates that exceed the allowable maximum for advanced integrated logic and memory circuits if the alpha particles are allowed to penetrate into the substrate or device levels of the integrated circuit. The substrate may include the silicon portions of active devices (examples of which include field effect and bipolar transistors) that can be sensitive to alpha particle-induced upsets, and device levels may include portions of the active devices above the surface of the substrate and containing semiconductor materials, such as polysilicon gates of field effect transistors.

As integrated circuit devices continue to be scaled, capacitor cell sizes and operating voltages continue to decrease while circuit density increases. This causes an increase in the probability of an integrated circuit experiencing a soft error. Therefore, there is a need for improved methods and structures for reducing soft error rates in integrated circuits.

SUMMARY

In a first aspect, a method is disclosed that includes providing a semiconductor substrate having one or more device levels formed on a top surface of the substrate, the one or more device levels including at least a portion of a number of devices. The method also includes forming a number of wiring levels on a top surface of the one or more device levels, wherein one or more of the number of wiring levels includes one or more alpha particle blocking shields situated between at least one of the number of devices and a predetermined first location where a terminal pad will be formed in one of the wiring levels, the one or more alpha particle blocking shields placed at one or more second locations, having one or more widths, and occupying a predetermined number of the wiring levels, wherein the one or more second locations, the one or more widths and the predetermined number of wiring levels are sufficient to prevent a predetermined percentage of alpha particles of a selected energy or less expected to be emitted from an alpha particle emitting metallization to be formed adjacent and connected to the terminal pad from reaching the one device.

In a second aspect, an integrated circuit is disclosed that includes a semiconductor substrate having one or more device levels formed on a top surface of the substrate, the one or more device levels comprising at least a portion of a multitude of devices. The integrated circuit also includes a number of wiring levels on a top surface of the one or more device levels. One or more of the wiring levels includes one or more alpha particle blocking shields situated between one or more of the devices and a predetermined first location where a terminal pad will be formed in one of the wiring levels. The one or more alpha particle blocking shield is placed at one or more second locations, has one or more widths, and occupies a predetermined number of the number of wiring levels, wherein the one or more second locations, the one or more widths and the predetermined number of wiring levels are sufficient to prevent a predetermined percentage of alpha particles of a selected energy or less expected to be emitted from an alpha particle emitting metallization to be formed adjacent and connected to the terminal pad from reaching the one or more devices.

BRIEF DESCRIPTION OF THE SEVERAL VIEWS OF THE DRAWINGS

The foregoing and other aspects of embodiments of this invention are made more evident in the following Detailed Description of Exemplary Embodiments, when read in conjunction with the attached Drawing Figures, wherein.

DETAILED DESCRIPTION

Figure 4:
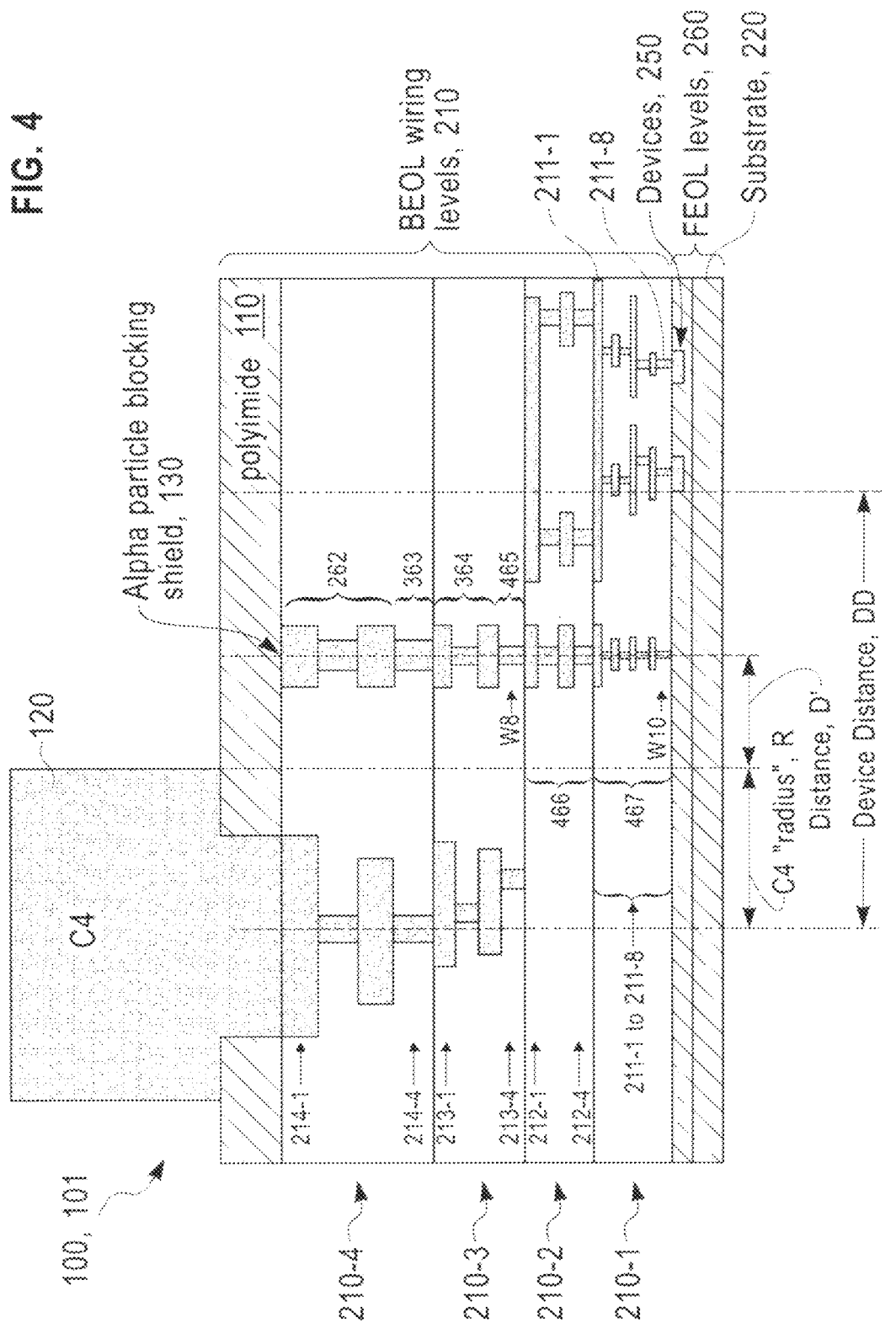
FIG. 4 is a cross-sectional view through line 2-2 of FIG. 1 of another exemplary embodiment of an alpha particle blocking shield placed in an integrated circuit chip at a selected location, having at least one width, and occupying a predetermined number of wiring levels.

As described above, one significant source of alpha particles is solder bumps, as these solder bumps contain lead (Pb), tin (Sn) or a combination of Pb and Sn (or their alloys, such as Sn alloyed with Ag), and therefore the solder bumps may contain radioactive polonium (Po) and Pb isotopes that may emit about 5.3 MeV alpha particles. Because the location of solder bumps often resides along the periphery of an integrated circuit chip, a structure (such as an alpha particle blocking shield described herein) can be implemented that provides enough stopping power to prevent the alpha particles from reaching the sensitive areas of the chip through a combination of materials and distance. By calculating the necessary amount of material to stop alpha particles, the alpha particle blocking shield can be placed close to the regions of the solder bumps and allow the majority of the chip design to be unaffected. One exemplary embodiment uses a procedure similar to that outlined in U.S. Pat. No. 7,386,817 to determine the amount of material to stop alpha particles. In an exemplary embodiment, the alpha particle blocking shield is placed at the highest (e.g., uppermost) back end of line (BEOL) level, where the angle of the alpha particles emitted from the solder bumps are effectively blocked from reaching the chip interior. In another embodiment, the BEOL wall will traverse the entire distance to the silicon (Si) surface. In another exemplary embodiment, the BEOL blocking level will be corrugated to allow metal wires designed to provide power to the chip from the solder bumps to pass through the alpha particle blocking shield. A benefit of certain of the alpha particle blocking shield embodiments herein, such as that shown in FIG. 4, is to provide an additional region to stop cracks from progressing through the BEOL low-k levels, which are more sensitive to cracking than are silicon dioxide based dielectric levels.

Figure 1:
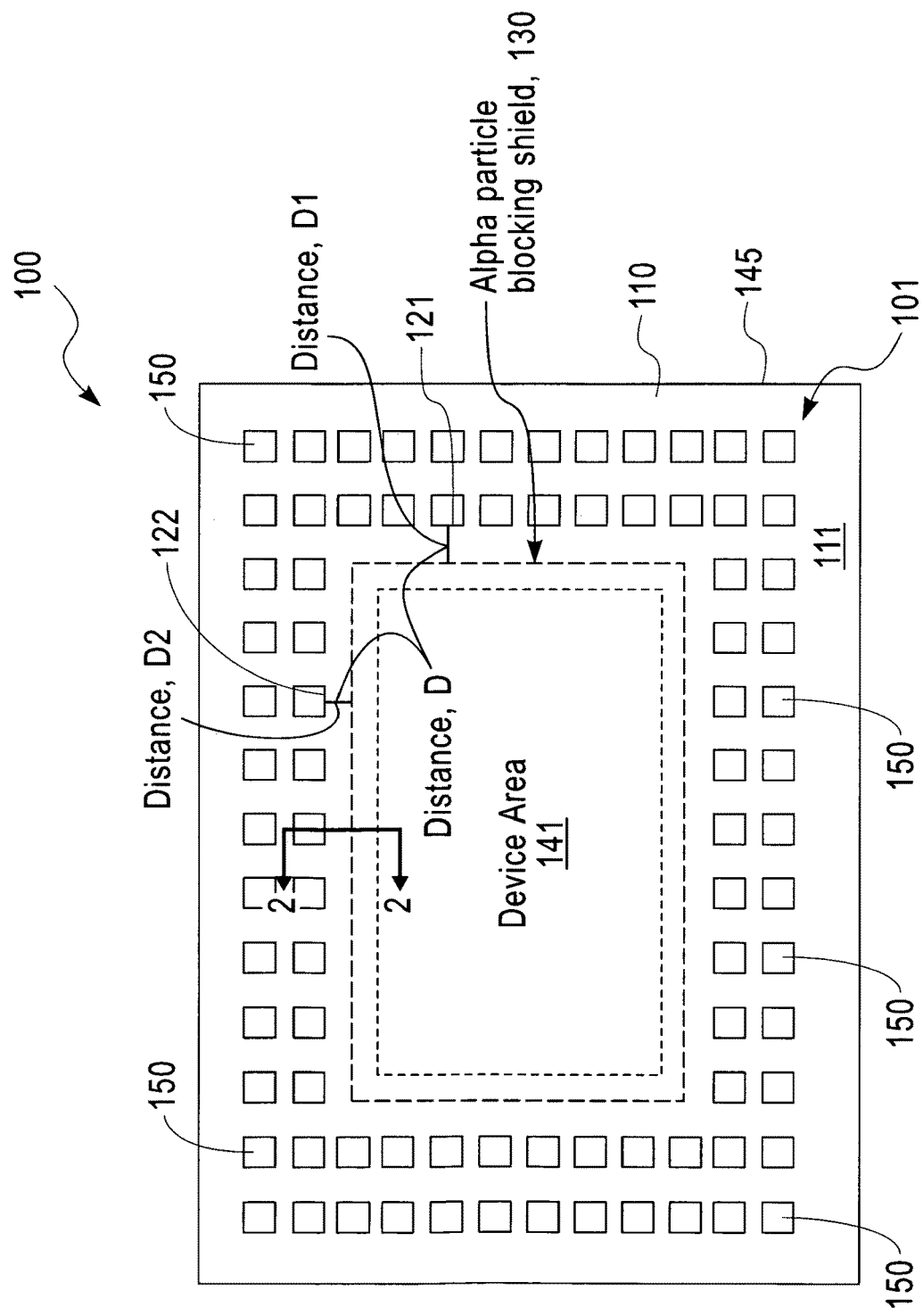
FIG. 1 is a top view of an integrated circuit chip having an alpha particle blocking shield between alpha particle producing metallization (C4 bumps in this example) and a device area.

Turning now to FIG. 1, FIG. 1 is a top view of an integrated circuit chip 100 comprising an integrated circuit 101. It is noted that typically a number of integrated circuits are formed on a substrate (such as a bulk substrate for a wafer or a silicon-on-insulator (SOI) substrate) and then the substrate is diced into a number of integrated circuit chips. The integrated circuit chip therefore contains an integrated circuit. In the examples given below, reference mainly will be made to the integrated circuit chip 100 for ease of exposition, but it should be clear that each integrated circuit chip 100 has at least one integrated circuit 101 therein. The integrated circuit chip 100 has an alpha particle blocking shield 130 between alpha particle producing metallization and a device area 140. Terminal pads, in this case C4 pads 150, are in particular locations and configured to be connected to C4 bumps (not shown in FIG. 1 but shown in other figures such as FIG. 2A or 2B). The integrated circuit chip 100 has a polyimide level 110. In and on top of (i.e., on surface 111 of) the polyimide level 110 are to be placed a number of C4 bumps (also called "solder bumps" herein) at the C4 pads 150 around the periphery 145 of the integrated circuit chip 100. A device area 140 is internal to the integrated circuit chip 100, is beneath the polyimide level 110, and is thus shown via a dashed line. An alpha particle blocking shield 130 is also internal to the integrated circuit chip 100, is beneath the polyimide level 110, and is thus shown via a dashed line.

The alpha particle blocking shield 130 is an alpha particle blocking shield defined (as described in more detail below) in this example to be placed at certain locations, to have certain widths, and to occupy a predefined number of wiring levels such that the alpha particle blocking shield 130 prevents a predetermined percentage of alpha particles of a selected energy or less expected to be emitted from an alpha particle producing metallization (in this example, C4 bumps that will be placed on C4 pads 120) from reaching one or more of the devices in the device area 140. In this example, devices near the periphery 141 are the devices to be used to determine the locations, widths, and number of wiring levels. The alpha particle blocking shield 130 is therefore placed at a distance, D, from the edges 121, 122 of the C4 pads 120.

In this example, because the periphery 141 of the device area 140 is equidistant from the periphery 145 of the integrated circuit chip 100, distance D does not vary in the "longitudinal" direction (illustrated by distance D1) or in the "vertical" direction (illustrated by distance D2), where these directions are defined for this particular orientation of the integrated circuit chip 100. Therefore, the alpha particle blocking shield 130 is also equidistant from the periphery 140 of the integrated circuit chip 100. However, distances D1 and D2 may be modified, depending on how the device area 140 is structured. This is described in more detail below. Further, the alpha particle blocking shield 130 is shown unbroken, but there may be portions not needed, e.g., because certain devices in the device area 140 are separated from associated ones of the C4 pads 150 by a distance such that an alpha particle blocking shield 130 is not necessary in that area. Additionally, the alpha particle blocking shield 130 might be corrugated, as described below. It is noted that FIG. 1 is not drawn to scale.

Figure 2A:
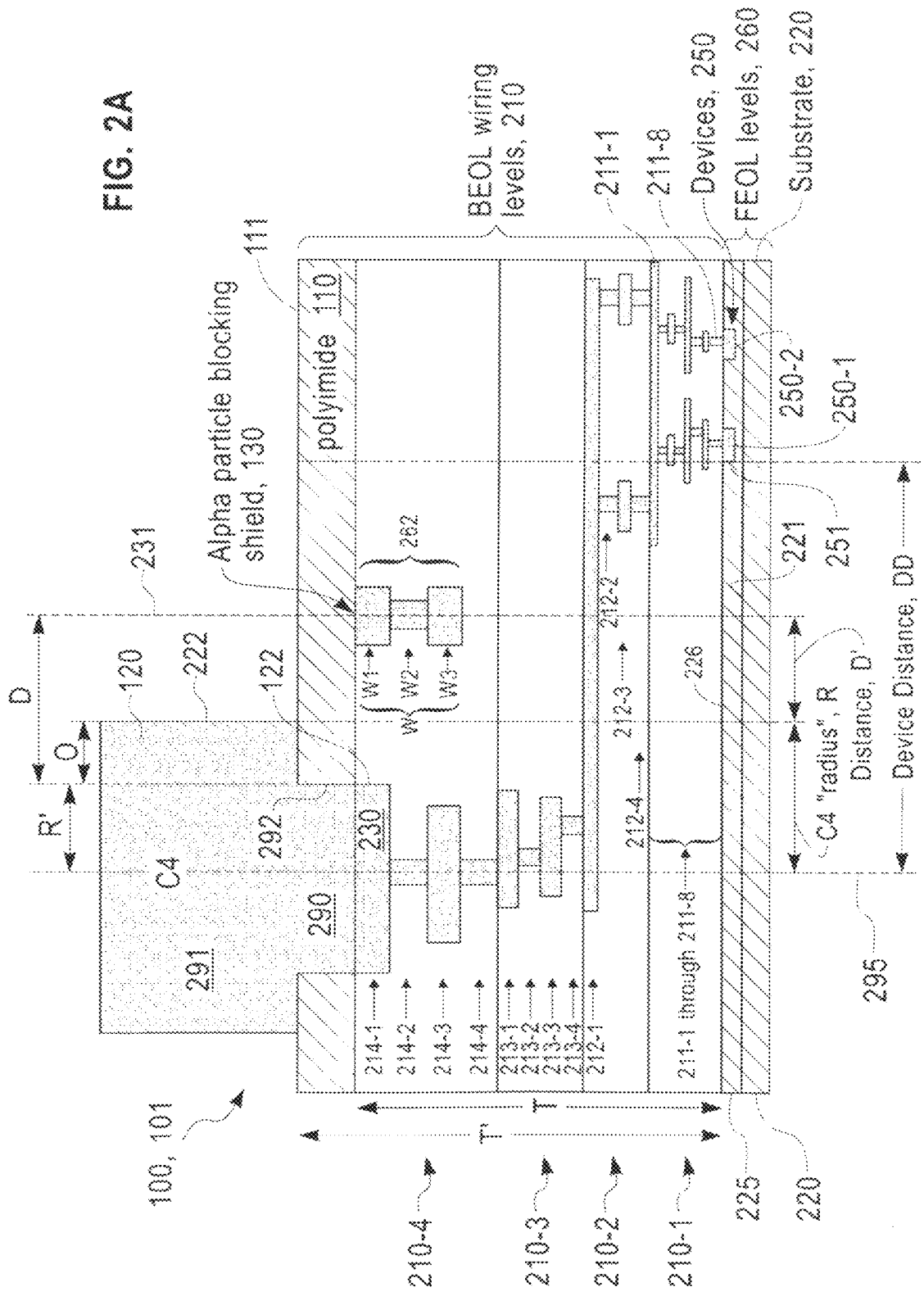
FIG. 2A is a cross-sectional view through line 2-2 of FIG. 1 of one exemplary embodiment of an alpha particle blocking shield placed in an integrated circuit at a selected location, having at least one width, and occupying a predetermined number of wiring levels.

Turning to FIG. 2A, FIG. 2A is a cross-sectional view through line 2-2 of FIG. 1 of one exemplary embodiment of an alpha particle blocking shield 130 placed in an integrated circuit at a selected location, having at least one width, and occupying a predetermined number of wiring levels. The integrated circuit chip 100 in this example has an alpha particle blocking shield 130 located at a distance D' from an edge 222 of the C4 bump 120. The distance D is also shown from edge 122 of the C4 pad 230 (e.g., corresponding to one of the C4 pads 150 shown in FIG. 1), which also corresponds to an edge 292 of base 290 of the C4 bump 120. Also shown is an overlay, O, that is a distance typically known. Therefore, one or both of the distances D or D' may be used for determination of the characteristics of the alpha particle blocking shield 130.

There are a number of back end of line (BEOL) wiring levels 210 formed on a top surface 226 of one or more device levels 225. The one or more device levels 225 include all or portions of one or more devices 250 (shown are devices 250-1 and 250-2). The one or more device levels 225 are formed on a top surface 221 of a substrate 220. Front end of line (FEOL) levels 260 include the one or more device levels 225 and the substrate 220.

The FEOL levels 260 can be silicon-on-insulator (SOI), which means that (see FIG. 2B) an SOI substrate 1020 includes a bulk substrate 1040 that has an insulator layer (BOX) 1030 and formed on the top surface 1021 of the SOI substrate 1020, a thin silicon layer. This implies that the one or more device levels 225 would be multiple levels and the devices 250 would be entirely within the multiple device levels 225. In FIG. 2A, the substrate 220 is bulk silicon, which means that devices 250 in the one or more device levels 225 could be partially implemented in the substrate 220. For example, the source, drain, and channel of a field effect transistor (FET) would generally be implemented in the substrate 220, and the metal and oxide of the gate and metal connections (e.g., vias) to the source and drain would generally be implemented in the one or more device levels 225.

BEOL wiring levels 210 have different minimum sizes, moving from 1× at the lowermost level 210-1, to 2× at level 210-2, to 4× at level 210-3, to 8× at the uppermost level 210-4. "1×" is used to indicate the smallest line width available for a particular semiconductor processing system. It is noted that there could be additional variants to the wiring levels, such as 1.5×, 16× and the like. In this example, each of the BEOL wiring levels 210 includes a number of layers of metallization possesses levels corresponding to metal lines and levels corresponding to metal vias. The metal vias in general have a smaller width than the lines. The two types of levels alternate in this example, which is the cause of the differing widths in the figures for the alpha particle blocking shield 130 (for instance). As an example, the BEOL wiring level 210-4 includes two layers 214-1 and 214-3 corresponding to lines and two layers 214-2 and 214-4 corresponding to vias. Similarly, the BEOL wiring level 210-3 includes two layers 213-1 and 213-3 corresponding to lines and two layers 213-2 and 213-4 corresponding to vias. Additionally, the BEOL wiring level 210-2 includes two layers 212-1 and 212-3 corresponding to lines and two layers 212-2 and 212-4 corresponding to vias. Finally, the BEOL wiring level 210-1 includes eight layers 211-1 through 211-8, of which layers 211-1, 211-3, 211-5, and 211-7 correspond to lines and layers 211-2, 211-4, 211-6, and 211-8 correspond to vias.

The C4 bump 120 has a predetermined geometry, in this case a base 290 and a bump portion 291. The base 290 is rectangular in this example, but non-rectangular bases may also be used. The bump portion 291 may have a number of different configurations, but a cylinder can be assumed in some embodiments. The bump portion 291 overhangs the surface 111 of the polyimide level 110 by the overhang distance, O. The C4 bump 120 is electrically and mechanically connected to a terminal pad 230 (in this case, a C4 pad) through techniques known to those skilled in the art. The C4 bump 120 has a radius, R, and a portion of the C4 bump 120 from center 295 to the edge 292 is also shown as radius, R'.

Additionally, the thickness T of the BEOL wiring levels 210 and the thickness T' (the thickness T and the thickness of the polyimide level 110) are known. Distance (DD) between center 295 of the C4 bump 120 and an edge 251 of a device 250-1 (or any other device 250) is also known, as is the geometry of the device 250-1. Therefore, distances between any part of the C4 bump 120 and any one of the devices 250 are known. The C4 bump 120 may include lead (Pb), tin (Sn) or a combination of Pb and Sn and their alloys, and therefore may contain radioactive polonium (Po) and Pb isotopes that may emit about 5.3 MeV alpha particles. This energy and the radioactive elements are merely exemplary. The distances D and D' are measured from the center 231 of the alpha particle blocking shield 130.

Figure 2B:
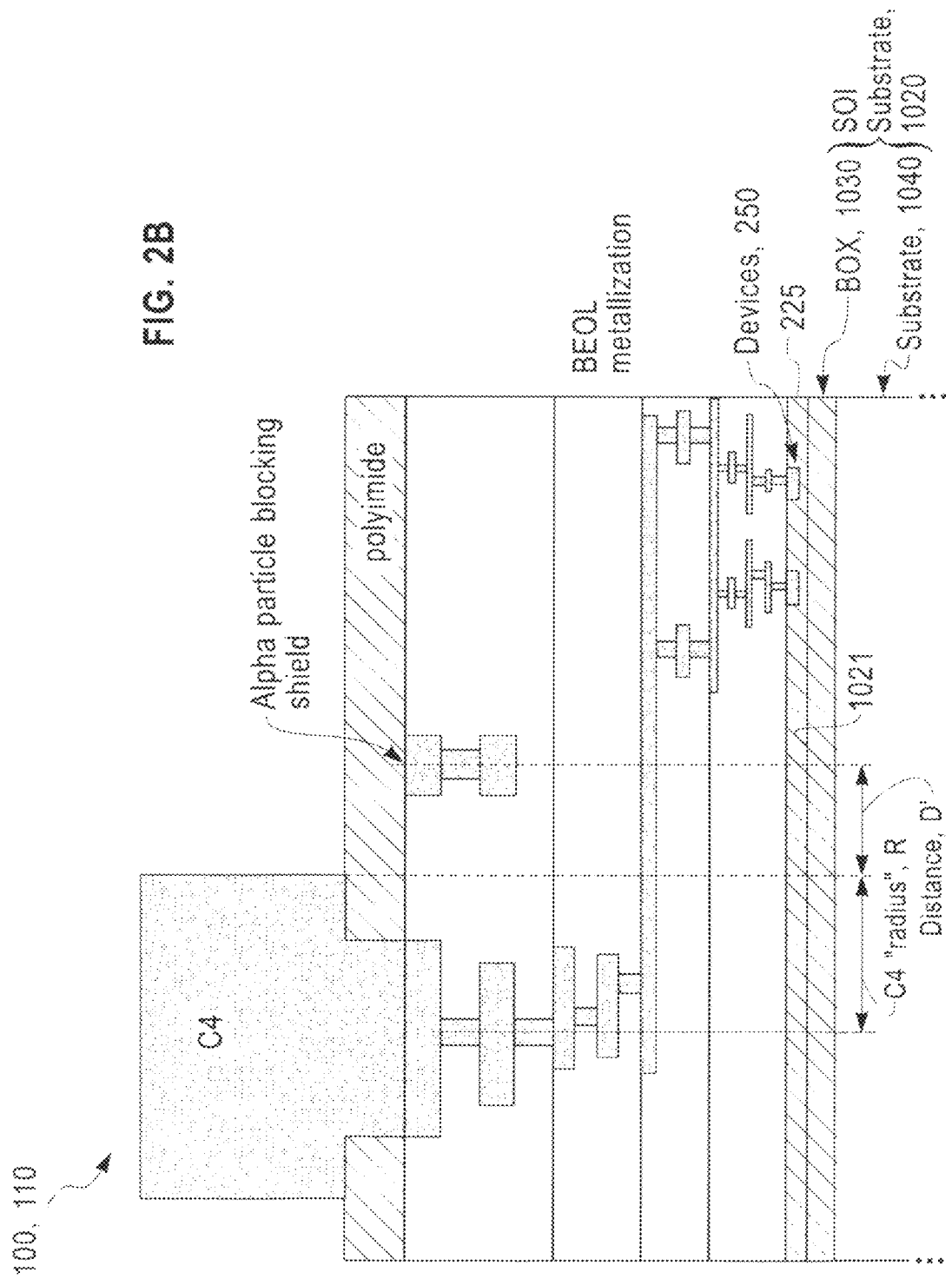
FIG. 2B is the same cross-sectional view through line 2-2 of FIG. 1 of the integrated circuit, except that the substrate of FIG. 2A is a silicon-on-insulator (SOI) substrate.

Based on this configuration information and the energy of the alpha particles expected to be emitted, the alpha particle blocking shield 130 is positioned at a location (distance D or D') between the alpha particle producing metallization of the C4 bumps 120 and the devices 250. Current specifications for alpha emissions from a blanket film of solder material are 20 counts per ($cm^2$ khr) where khr is in units of 1000 hours. Recent specifications are even lower, 2 counts per ($cm^2$ khr). The alpha particle blocking shield 130 also has a number of widths W, including widths W1, W2, and W3 (corresponding to line 214-1, via 214-2, and line 214-3 levels, respectively), wherein W1=W3 in this example. These widths are dependent on the semiconductor processing being used, and are merely exemplary. Different BEOL systems may have different requirements for the widths at these levels. The alpha particle blocking shield 130 also occupies a number of the BEOL metallization wiring levels 210. In the example of FIGS. 2A and 2B, the portion 262 of BEOL metallization wiring level 210-4 is occupied by the alpha particle blocking shield 130. The location D or D', widths W, and number of BEOL metallization wiring levels 210 (and portions thereof) are determined as being sufficient to prevent a predetermined percentage of alpha particles of a selected energy or less expected to be emitted from the alpha particle producing metallization (the C4 bump 120 in this example) from reaching one or more of the devices 250.

The alpha particle blocking shield 130 can comprise metals such as Cu, W, Al, Ta, Ru and alloys of these metals containing C, S, Cl, O, N, Mn, Al, and Ti. Other possible metals are Mo, Nb, Co, Ni, Au, Rh, Ir, Pd and Pt and other possible alloying elements are Sn, In, Pd, Au, Ag, Nb, Cr, B, Zn, V, Mg and P. Typically, for ease of integration into BEOL processing, the alpha particle blocking shield 130 will be metal, as just described. However, the alpha particle blocking shield 130 could be a high-Z material (W, Ta, etc.), where the trenches for the shield would be etched and deposited after the BEOL metallization has been formed.

Figure 3:
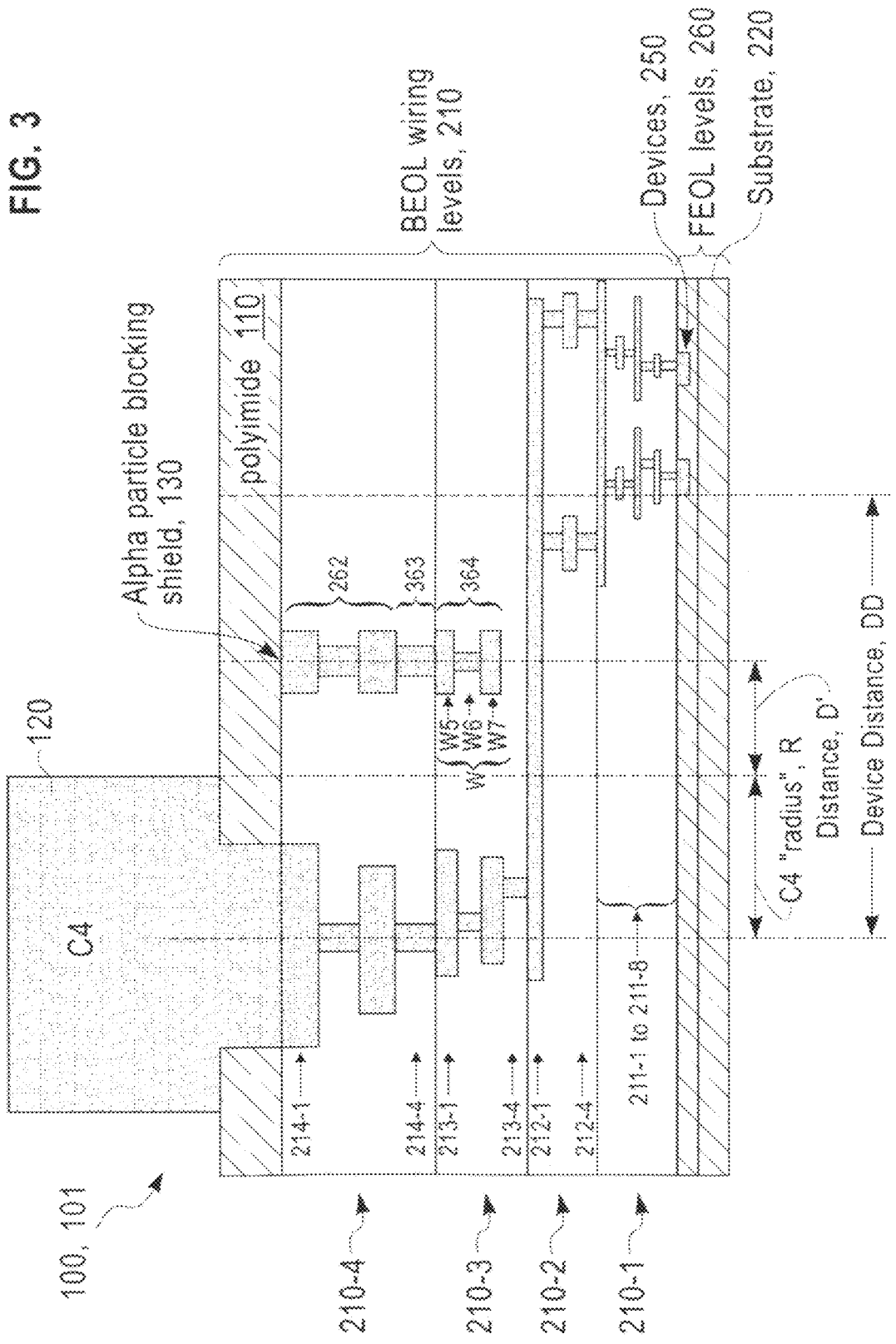
FIG. 3 is a cross-sectional view through line 2-2 of FIG. 1 of another exemplary embodiment of an alpha particle blocking shield placed in an integrated circuit chip at a selected location, having at least one width, and occupying a predetermined number of wiring levels.

Referring now to FIG. 3, this figure is a cross-sectional view through line 2-2 of FIG. 1 of another exemplary embodiment of an alpha particle blocking shield 130 placed in an integrated circuit chip at a selected location, having at least one width, and occupying a predetermined number of wiring levels. This example shows the alpha particle blocking shield 130 extending, relative to the alpha particle blocking shield 130 shown in FIG. 1, through the rest of the BEOL metallization wiring level 210-4 (e.g., shown as portion 363, corresponding to the via level 214-4), and through a portion 364 of the BEOL metallization wiring level 210-3. The portion 364 includes widths W5, W6, W7 corresponding to line level 213-1, via level 213-2, and line level 213-3.

Turning now to FIG. 4, FIG. 4 is a cross-sectional view through line 2-2 of FIG. 1 of another exemplary embodiment of an alpha particle blocking shield 130 placed in an integrated circuit chip at a selected location, having at least one width, W, and occupying a predetermined number of wiring levels. The alpha particle blocking shield 130 in this example also extends through BEOL metallization wiring level 210-3 (by portion 465), extends through BEOL metallization wiring level 210-2 (by portion 466), and extends through BEOL metallization wiring level 210-1 (by portion 467). One benefit of this embodiment is that it helps to arrest crack propagation.

Figure 5:
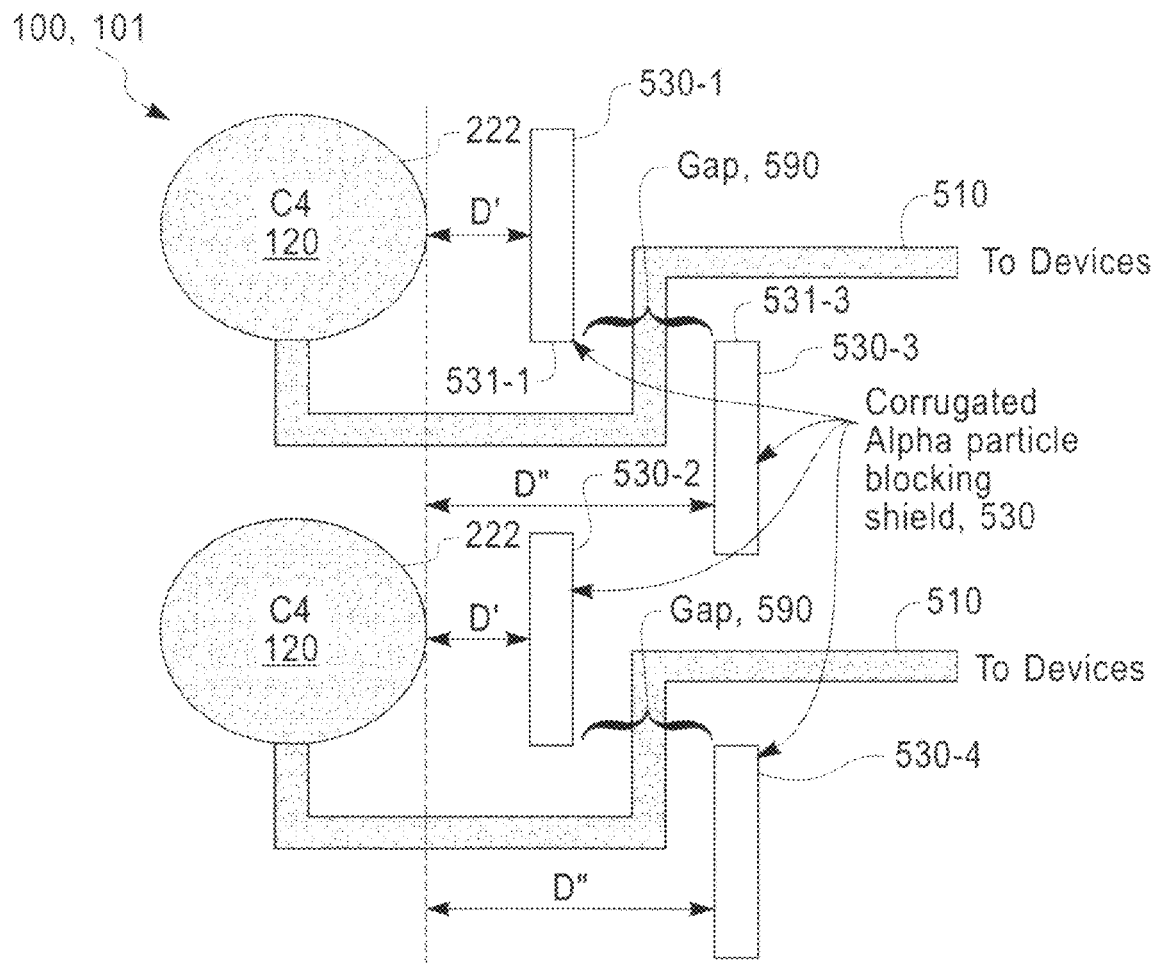
FIG. 5 is a top view of a portion of an integrated circuit chip illustrating corrugating an alpha particle blocking shield to provide power to devices in the integrated circuit chip from the solder bumps to pass.

Referring now to FIG. 5, this is a top view of a portion of an integrated circuit chip illustrating corrugating an alpha particle blocking shield 130. The corrugation provides gaps 590 in the alpha particle blocking shield 103, and the gaps 590 provide a path for power lines to pass through the path to devices in the integrated circuit chip from the solder bumps. The corrugated alpha particle blocking shield 530 includes alpha particle blocking shields 530-1 and 530-2 at locations D' from the edges 222 of respective ones of the C4 bumps 120. The corrugated alpha particle blocking shield 530 also includes alpha particle blocking shields 530-3 and 530-4 at locations D" from edges 222 of respective ones of the C4 bumps 120. The corrugation allows power lines 510 to pass through the corrugated alpha particle blocking shield 530 to the devices 250 while still providing an effective shield to alpha particles emitted from the C4 bumps 120. In an exemplary embodiment, the distance D" shown in FIG. 5 is approximately or equivalently equal to the distance D' shown in and described in reference to FIGS. 2A, 2B, 3, and 4. This means that the distance D' in FIG. 5 is less than the distance D' in FIGS. 2A, 2B, 3, and 4.

Figure 6A:
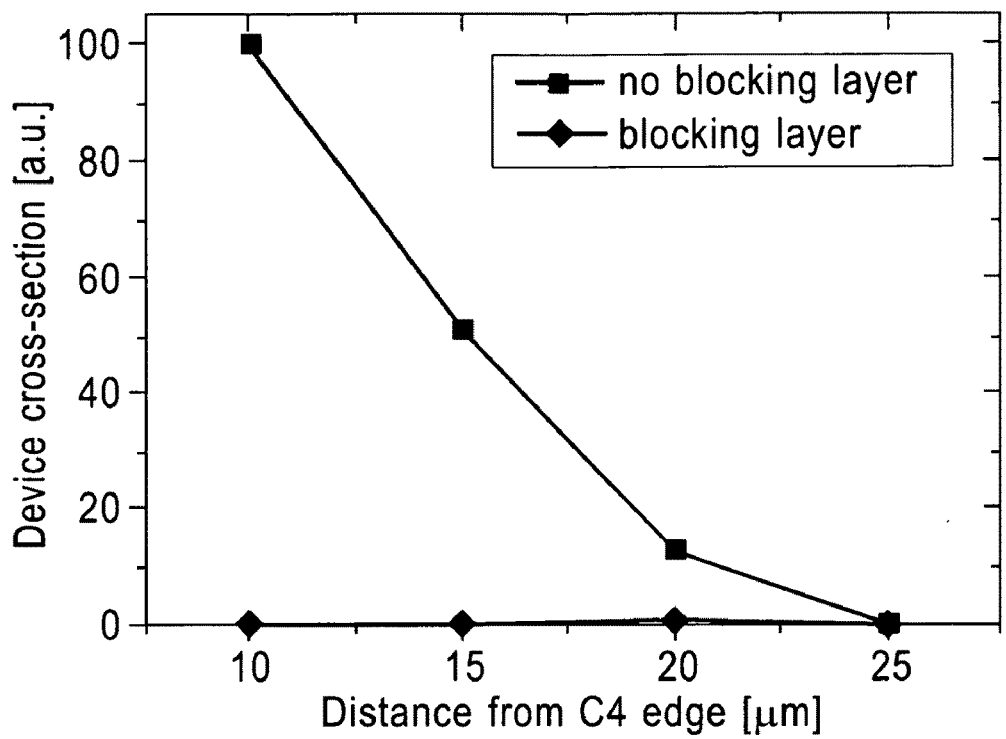
FIG. 6A is a graph of a single-event upset cross-section (in arbitrary units, a.u.) versus distance from an edge of a C4 pad, assuming a critical charge of 0.5 fC (femto-Coulombs)
Figure 6B:
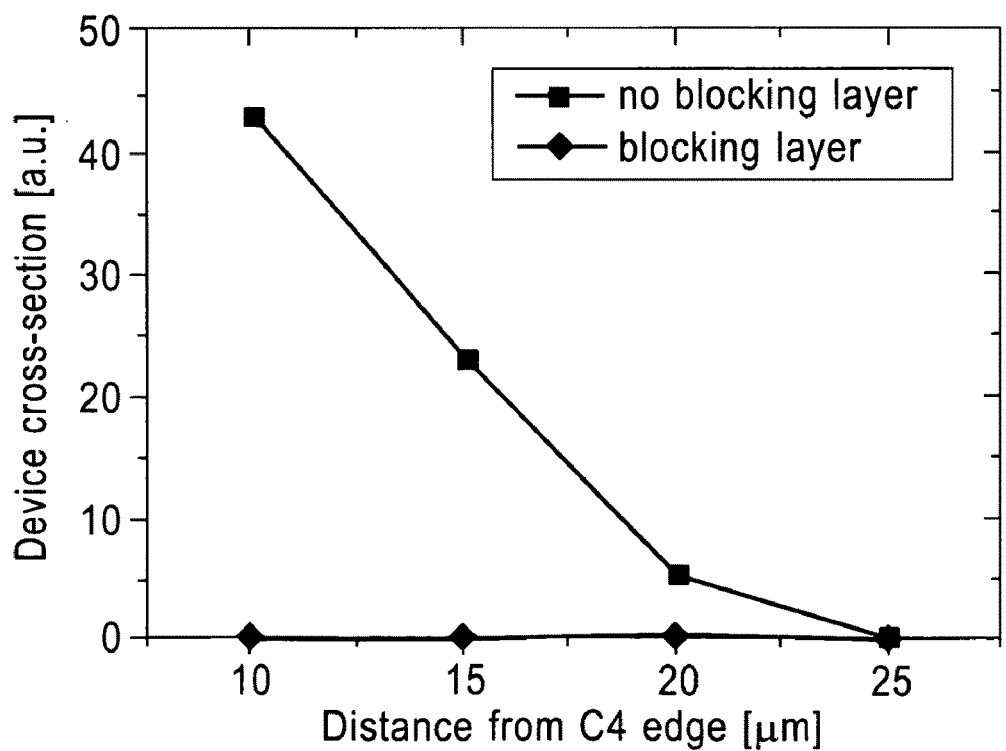
FIG. 6B is a graph of a single-event upset cross-section (in arbitrary units, a.u.) versus distance from an edge of a C4 pad, assuming a critical charge of 1.0 fC.

FIGS. 6A and 6B show results from two sets of simulations performed on the effectiveness of an alpha particle blocking shield 130 in mitigating soft error rate (SER) failure in devices 250 close to C4 bumps 120. These two figures show the difference in device single-event upset cross-section (in arbitrary units, a.u.) with and without a 5 μm (micron) wide blocking level placed 5 μm away from the C4 edge 222, as a function of various distances from the C4 edge 222. "Single-event upset" is another term for a soft error (i.e., switch in device state due to a particle strike). The examples of FIGS. 6A and 6B were developed using a "full shield" configuration as shown in FIG. 4 (that is, the alpha particle blocking shield 130 penetrates every BEOL level 210). In the examples of FIGS. 6A and 6B, each of the widths W (i.e., W1 through Wn) was 5 μm wide. The cross-section is proportional to the estimated failure rate of a device due to charge that is deposited during a particle strike. If enough charge, called the critical charge, is deposited in the device body, then the state of a transistor (for instance) can be flipped from one to zero or vice-versa. Because the critical charge depends on the particulars of the device design (device area, for example), two values of critical charge were chosen to simulate the device behavior. FIG. 6A assumes a critical charge of 0.5 femto-Coulombs (fC) and FIG. 6B assumes a value of 1.0 fC. As can be seen from the y-axis of the figures, the device cross-section will be bigger (i.e., more failures) if the critical charge for the device is smaller.

Also, the alpha particle blocking shield 130 shields all of the alpha particle strikes for devices placed at 10, 15 and 25 μm away from the C4 edge 222 and allows a very small number of particles to deposit charge into devices at 20 μm away. The charge at 20 μm occurs because the alpha particles are basically being "stopped" near this point, and extra charge deposition occurs near the stopping point. This point will change depending on energy the alpha particles are assumed to have. In this case, the alpha particles were assumed to have 5.3 MeV.

One can also see from FIGS. 6A and 6B that the overall number of particles that can deposit charge in devices 25 μm away from the edge 222 of the C4 bumps 120 is small even without a blocking level due to the stopping power of the dielectric in the integrated circuit chip 100. Regardless, a result of using the alpha particle blocking shield 130 is that devices can be placed 15 μm closer to the edge 222 of the C4 bumps 120 compared to the case without the shield.

Figure 7:
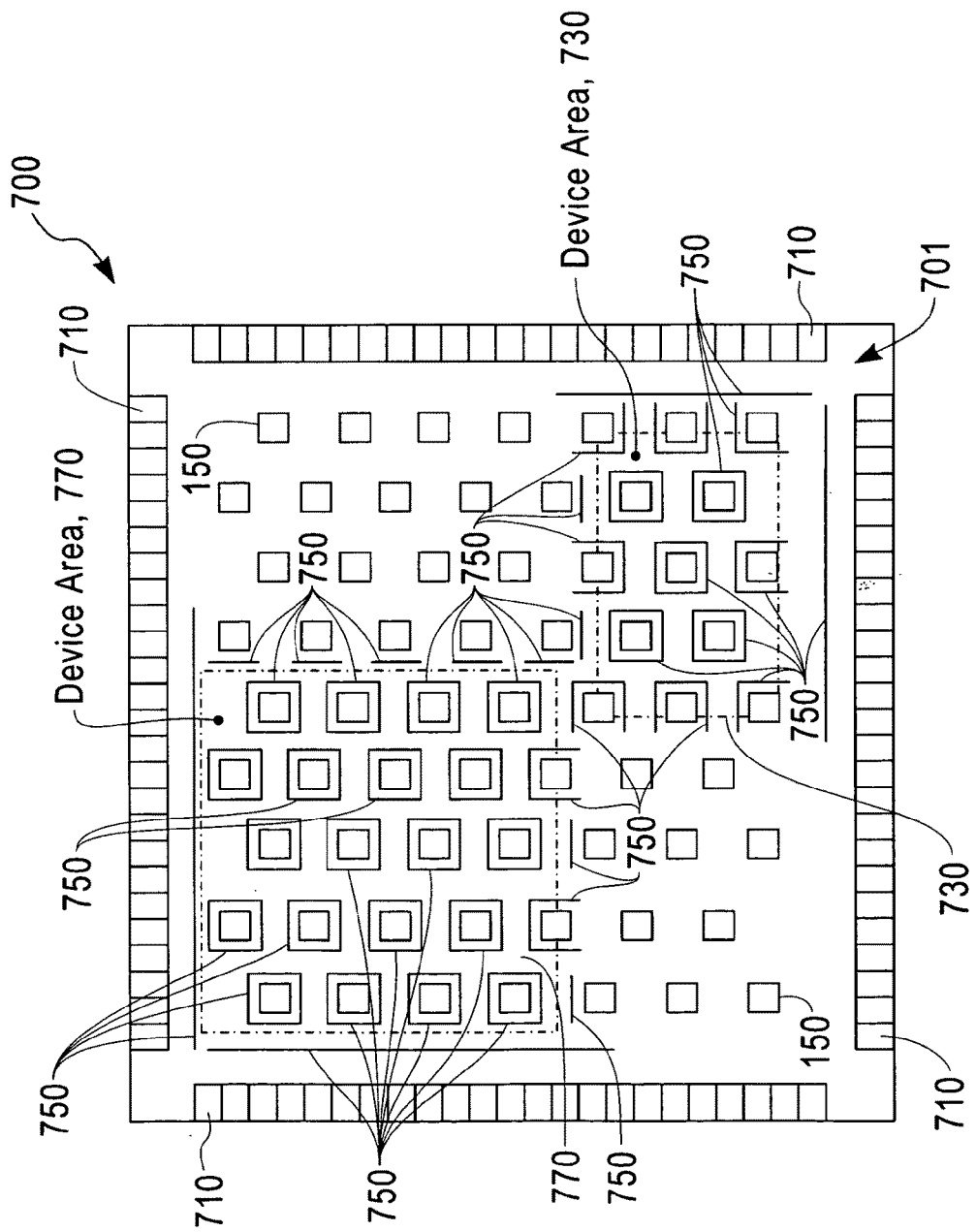
FIG. 7 is a top view of an integrated circuit chip showing both wire bond pads and C4 pads and placement of alpha particle blocking shields in order to shield devices in device areas of the integrated circuit chip.

FIG. 7 is a top view of an integrated circuit chip 700 having an integrated circuit 701 and showing terminal pads including both wire bond pads 710 and C4 pads 150 and placement of alpha particle blocking shields 750 in order to shield devices in device areas 720, 730 (shown inside rectangles of dashed lines) of the integrated circuit chip 700. It is assumed the two device areas 720, 730 need more protection from alpha particles than the other areas of the chip. The alpha particle blocking shield 750 can ring the C4 pads 150 or cover one or more sides of the C4 pads 150. It is noted that one can put a shield under a C4 pad 150 that is above one of the areas 720, 730 as described in U.S. Pat. No. 7,381,635, but leave areas not under a C4 pad without a shield. However, the shield has to be of sufficient thickness to shield the alpha particles, which means that the shield would have to be 10 μm or thicker and this introduces additional manufacturing steps relative to the alpha particle blocking shields described herein. Also, such a shield will not shield alpha particle strikes that are emitted at larger angles, although a combination of a shield as in U.S. Pat. No. 7,381,635, underlying a C4 pad 150 and a ring of an alpha particle blocking shield 750 should shield all alpha particles from reaching devices in the device areas 720, 730.

Figure 8:
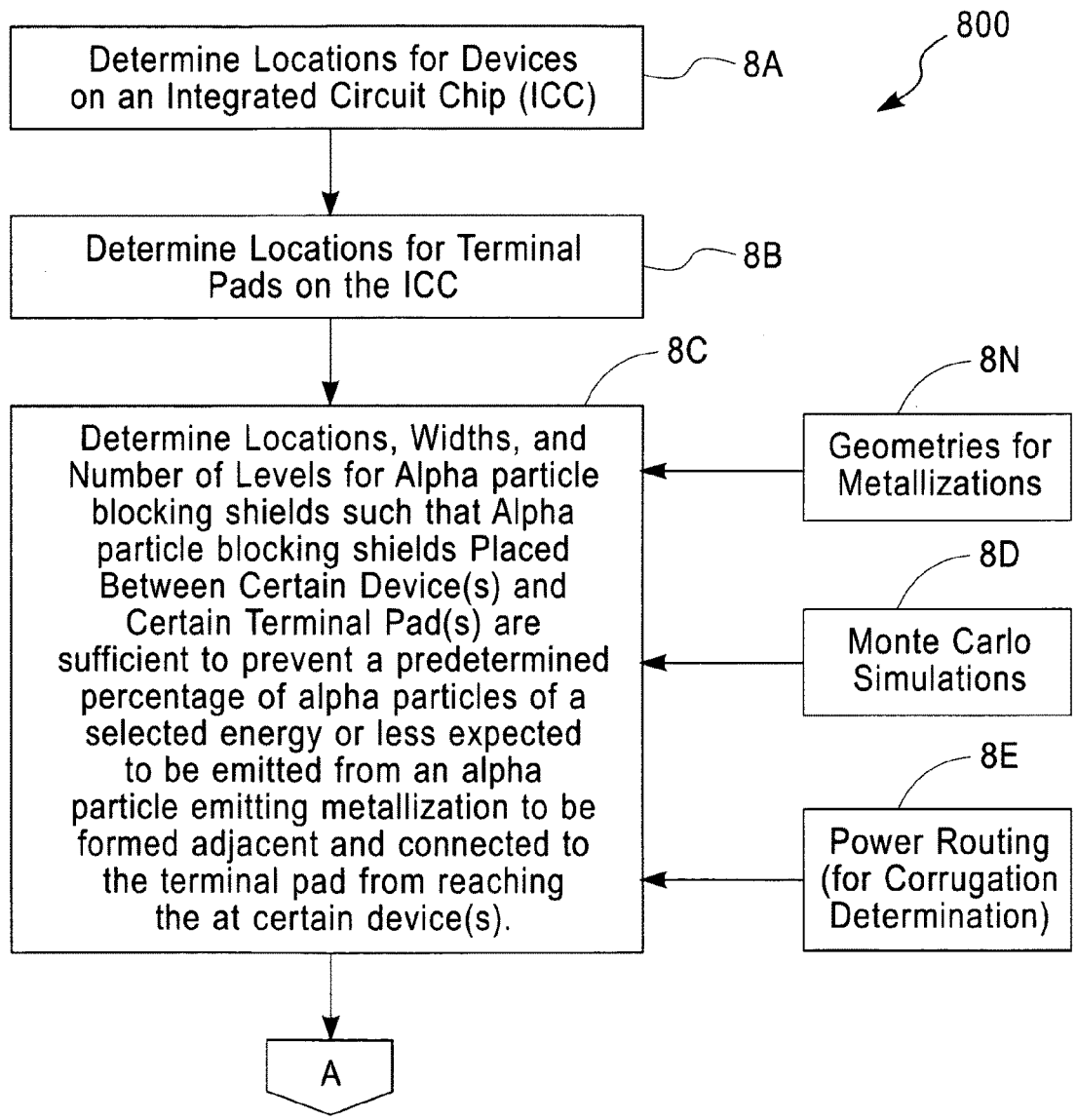
FIG. 8 is a block diagram of a flowchart of an exemplary method for creating integrated circuit chips having alpha particle blocking shields.
Figure 8:
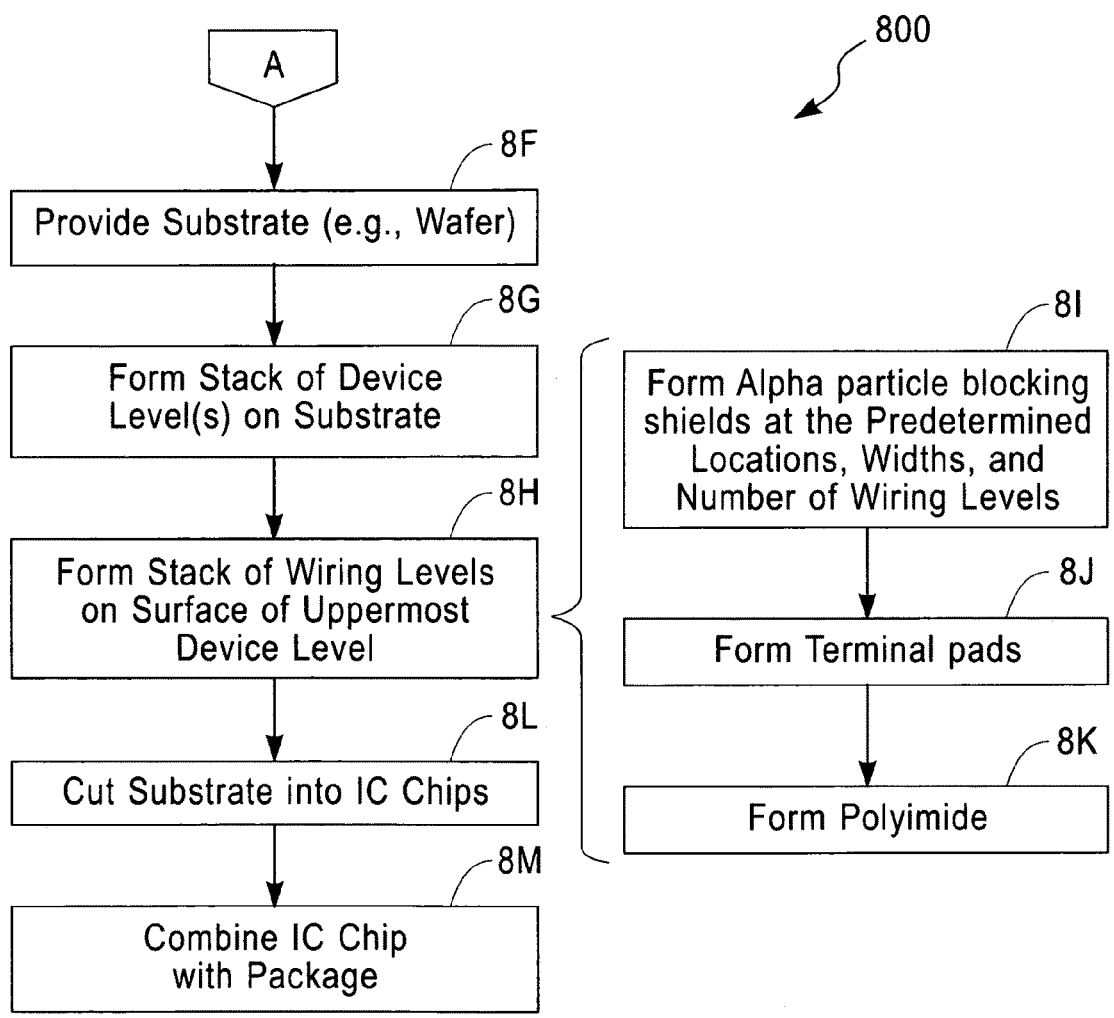

Turning to FIG. 8, a block diagram is shown of a flowchart of an exemplary method 800 for creating integrated circuit chips having alpha particle blocking shields. In block 8A, locations are determined for devices 250 on an integrated circuit chip 100, 700. In block 8B, locations are determined for terminal pads (e.g., C4 pads 150 and/or wire bond pads 710). In block 8C, locations, widths, and number of levels for alpha particle blocking shields are determined such that alpha particle blocking shields placed between certain device(s) and certain terminal pad(s) are sufficient to prevent a predetermined percentage of alpha particles of a selected energy or less expected to be emitted from an alpha particle emitting metallization to be formed adjacent to and to be connected to the terminal pad(s) from reaching the certain device(s).

Block 8C may use Monte Carlo simulations 8D in order to determine the locations, widths, and number of levels for alpha particle blocking shields. Furthermore, power routing (block 8E) may serve as an input to block 8D, such that corrugation of certain of the alpha particle blocking shields may be determined. Note also that block 8C may include determining that a BEOL metallization wiring level 210 would be extended by an alpha particle blocking shield only by a portion of the level 210. Further, block 8C may use geometries for metallizations (block 8N), which provide geometries for C4 solder bumps, wire bond pads, and other types of metallizations.

In block 8F, a substrate (e.g., a wafer) is provided and in block 8G, a stack of one or more device layers on formed on the substrate. Blocks 8F and 8G form the FEOL levels 260. In block 8H, a stack of BEOL metallization wiring levels 210 are formed. Block 8H includes, in this example, forming alpha particle blocking shields (block 8I) at the predetermined locations, widths, and number of wiring levels 210. Note that block 8I may also include forming the alpha particle blocking shield in a portion of a BEOL metallization wiring level 210. Terminal pads are formed in block 8J. The polyimide 110 is formed in block 8K. In block 8L, the wafer/substrate is sliced into integrated circuit chips, and in block 8M, an integrated circuit chip is combined with a package. Such combination includes making connections between the integrated circuit chip and the package with the C4 bumps (and wire bond pads, if used).

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multi-chip package (such as a ceramic carrier that has either or both surface interconnections or buried interconnections). In any case the chip is then integrated with other chips, discrete circuit elements, and/or other signal processing devices as part of either an intermediate product, such as a motherboard, or an end product. The end product can be any product that includes integrated circuit chips, ranging from toys and other low-end applications to advanced computer products having a display, a keyboard or other input device, and a central processor.

The foregoing description has provided by way of exemplary and non-limiting examples a full and informative description of the best techniques presently contemplated by the inventors for carrying out embodiments of the invention.

However, various modifications and adaptations may become apparent to those skilled in the relevant arts in view of the foregoing description, when read in conjunction with the accompanying drawings and the appended claims. All such and similar modifications of the teachings of this invention will still fall within the scope of this invention.

Furthermore, some of the features of exemplary embodiments of this invention could be used to advantage without the corresponding use of other features. As such, the foregoing description should be considered as merely illustrative of the principles of embodiments of the present invention, and not in limitation thereof.

What is claimed is:

1. A method, comprising:
    providing a semiconductor substrate having at least one device level formed on a top surface of the substrate, the at least one device level comprising at least a portion of a plurality of devices; and
    forming a plurality of wiring levels on a top surface of the at least one device level, wherein at least one of the plurality of wiring levels comprises at least one alpha particle blocking shield situated between at least one of the plurality of devices and a predetermined first location where a terminal pad will be formed in one of the wiring levels, the at least one alpha particle blocking shield placed at least one second location, having at least one width, and occupying a predetermined number of the plurality of wiring levels, said predetermined first location and said at least one second location being separated laterally from one another, wherein the at least one second location, the at least one width and the predetermined number of wiring levels are sufficient to prevent a predetermined percentage of alpha particles of a selected energy or less expected to be emitted from an alpha particle emitting metallization to be formed adjacent and connected to the terminal pad from reaching the at least one device.

2. The method of claim 1, further comprising forming the terminal pad in the predetermined first location.

3. The method of claim 2, further comprising forming the metallization adjacent and mechanically connected to the terminal pad.

4. The method of claim 3, further comprising forming an integrated circuit chip comprising the substrate, the at least one device level, the plurality of wiring levels, the terminal pad, and the metallization, and attaching the integrated circuit chip to a package using at least the metallization.

5. The method of claim 3, wherein the terminal pad comprises a pad configured to be coupled to a controlled collapse chip connection solder bump and the metallization comprises the controlled collapse chip connection solder bump.

6. The method of claim 3, wherein the terminal pad comprises a wire bond pad configured to be coupled to a wire and the metallization comprises solder.

7. The method of claim 1, wherein the at least one second location comprises a plurality of second locations around a periphery of a device area that contains at least a portion of the plurality of devices and that is surrounded by a plurality of terminal pads, wherein the at least one alpha particle blocking shield is situated between the periphery of the device area and the plurality of terminal pads, and wherein the plurality of second locations, the at least one width and the predetermined number of wiring levels are sufficient to prevent the predetermined percentage of alpha particles of the selected energy or less expected to be emitted from a plurality of alpha particle emitting metallizations to be formed adjacent each of the terminal pads from reaching devices adjacent the periphery of the device area.

8. The method of claim 1, wherein the at least one alpha particle blocking shield is formed as a corrugated alpha particle blocking shield comprising a plurality of alpha particle blocking shields at a plurality of second locations corresponding to a plurality of terminal pads to be formed in the one wiring level, the corrugated alpha particle blocking shield formed such that some of the plurality of the alpha particle blocking shields are formed at a second location that is a first distance from associated ones of the terminal pads and others of the plurality of alpha particle blocking shield are formed at a second location that is a second distance from the associated ones of the terminal pads, wherein for each of the alpha particle blocking shields at the first distance, the first distance, the at least one widths of the alpha particle blocking shield and the predetermined number of wiring levels are sufficient to prevent a predetermined percentage of alpha particles of a selected energy or less expected to be emitted from an alpha particle emitting metallization to be formed adjacent and connected to the terminal pad from reaching an associated at least one device.

9. The method of claim 1, wherein the plurality of wiring levels are stacked from a lowermost wiring level to an uppermost wiring level, and wherein the at least one alpha particle blocking shield occupies a portion of the uppermost wiring level and does not occupy wiring levels other than the uppermost wiring level.

10. The method of claim 1, wherein the plurality of wiring levels are stacked from a lowermost wiring level to an uppermost wiring level, and wherein the at least one alpha particle blocking shield occupies the uppermost wiring level and at least one adjacent wiring level and does not occupy wiring levels other than the uppermost wiring level and the at least one adjacent wiring level.

11. The method of claim 1, wherein the at least one alpha particle blocking shield occupies each of the plurality of wiring levels.

12. The method of claim 1, wherein the at least one width comprises a plurality of widths.

13. An integrated circuit, comprising:
    a semiconductor substrate having at least one device level formed on a top surface of the substrate, the at least one device level comprising at least a portion of a plurality of devices; and
    a plurality of wiring levels on a top surface of the at least one device level, wherein at least one of the plurality of wiring levels comprises at least one alpha particle blocking shield situated between at least one of the plurality of devices and a predetermined first location where a terminal pad will be formed in one of the wiring levels, the at least one alpha particle blocking shield placed at least one second location, having at least one width, and occupying a predetermined number of the plurality of wiring levels, said predetermined first location and said at least one second location being separated laterally from one another, wherein the at least one second location, the at least one width and the predetermined number of wiring levels are sufficient to prevent a predetermined percentage of alpha particles of a selected energy or less expected to be emitted from an alpha particle emitting metallization to be formed adjacent and connected to the terminal pad from reaching the at least one device.

14. The integrated circuit of claim 13, further comprising a terminal pad formed in the predetermined first location.

15. The integrated circuit of claim 14, further comprising a metallization formed adjacent and mechanically connected to the terminal pad.

16. The integrated circuit of claim 15, wherein the integrated circuit is included in an integrated circuit chip attached to a package through at least the metallization.

17. The integrated circuit of claim 15, wherein the terminal pad comprises a pad configured to be coupled to a controlled collapse chip connection solder bump and the metallization comprises the controlled collapse chip connection solder bump.

18. The integrated circuit of claim 15, wherein the terminal pad comprises a wire bond pad configured to be coupled to a wire and the metallization comprises solder.

19. The integrated circuit of claim 13, wherein the at least one second location comprises a plurality of second locations around a periphery of a device area that contains at least a portion of the plurality of devices and that is surrounded by a plurality of terminal pads, wherein the at least one alpha particle blocking shield is situated between the periphery of the device area and the plurality of terminal pads, and wherein the plurality of second locations, the at least one width and the predetermined number of wiring levels are sufficient to prevent the predetermined percentage of alpha particles of the selected energy or less expected to be emitted from a plurality of alpha particle emitting metallizations to be formed adjacent each of the terminal pads from reaching devices adjacent the periphery of the device area.

20. The integrated circuit of claim 13, wherein the at least one alpha particle blocking shield is formed as a corrugated alpha particle blocking shield comprising a plurality of alpha particle blocking shields at a plurality of second locations corresponding to a plurality of terminal pads to be formed in the one wiring level, the corrugated alpha particle blocking shield formed such that some of the plurality of the alpha particle blocking shields are formed at a second location that is a first distance from associated ones of the terminal pads and others of the plurality of alpha particle blocking shield are formed at a second location that is a second distance from the associated ones of the terminal pads, wherein for each of the alpha particle blocking shields at the first distance, the first distance, the at least one widths of the alpha particle blocking shield and the predetermined number of wiring levels are sufficient to prevent a predetermined percentage of alpha particles of a selected energy or less expected to be emitted from an alpha particle emitting metallization to be formed adjacent and connected to the terminal pad from reaching an associated at least one device.

21. The integrated circuit of claim 13, wherein the plurality of wiring levels are stacked from a lowermost wiring level to an uppermost wiring level, and wherein the at least one alpha particle blocking shield occupies a portion of the uppermost wiring level and does not occupy wiring levels other than the uppermost wiring level.

22. The integrated circuit of claim 13, wherein the plurality of wiring levels are stacked from a lowermost wiring level to an uppermost wiring level, and wherein the at least one alpha particle blocking shield occupies the uppermost wiring level and at least one adjacent wiring level and does not occupy wiring levels other than the uppermost wiring level and the at least one adjacent wiring level.

23. The integrated circuit of claim 13, wherein the at least one alpha particle blocking shield occupies each of the plurality of wiring levels.

24. The integrated circuit of claim 13, wherein the at least one width comprises a plurality of widths.

\* \* \* \* \*